United States Patent
Schwarzer

[11] 4,359,719
[45] Nov. 16, 1982

[54] HALL EFFECT ALARM PULL STATION

[75] Inventor: Rudolf J. Schwarzer, Palatine, Ill.

[73] Assignee: Honeywell Inc., Minneapolis, Minn.

[21] Appl. No.: 194,532

[22] Filed: Oct. 6, 1980

[51] Int. Cl.³ .............................................. G08B 17/00
[52] U.S. Cl. ................................ 340/287; 338/32 H; 335/205
[58] Field of Search ............ 340/287, 297, 299, 365 L; 335/205, 206; 324/117 H, 251; 307/309; 338/32 H

[56] References Cited

U.S. PATENT DOCUMENTS

| | | | |
|---|---|---|---|
| 3,622,922 | 11/1971 | Mogi | 335/205 |
| 3,736,441 | 5/1973 | Masuda et al. | 335/205 |
| 3,777,255 | 12/1973 | Young et al. | 335/205 |
| 3,783,430 | 1/1974 | Nishiba et al. | 338/32 H |
| 3,855,439 | 12/1974 | Hermann | 338/32 H |
| 3,858,145 | 12/1974 | Sulich et al. | 335/205 |
| 3,882,337 | 5/1975 | Pfeffer et al. | 338/32 H |
| 3,950,719 | 4/1976 | Maxwell | 335/205 |
| 4,117,430 | 9/1978 | Sims, Jr. | 335/205 |
| 4,126,841 | 11/1978 | Maeno | 335/205 |
| 4,156,820 | 5/1979 | Fukuda et al. | 307/309 |

Primary Examiner—Gerald L. Brigance
Attorney, Agent, or Firm—Trevor B. Joike

[57] ABSTRACT

An alarm pull station is provided having a housing for attachment to a support, a manually movable member mounted within the housing and having a magnet attached thereto, and a Hall effect switching device responsive to movement of the magnet for providing an output signal. The Hall effect switching device can include first and second Hall effect sensors arranged for providing three levels of output signal, a first normal level when the manually movable member is in its original, unoperated position, an alarm level when the manually movable member is operated, and a trouble level when the pull station is subject to tampering.

6 Claims, 3 Drawing Figures

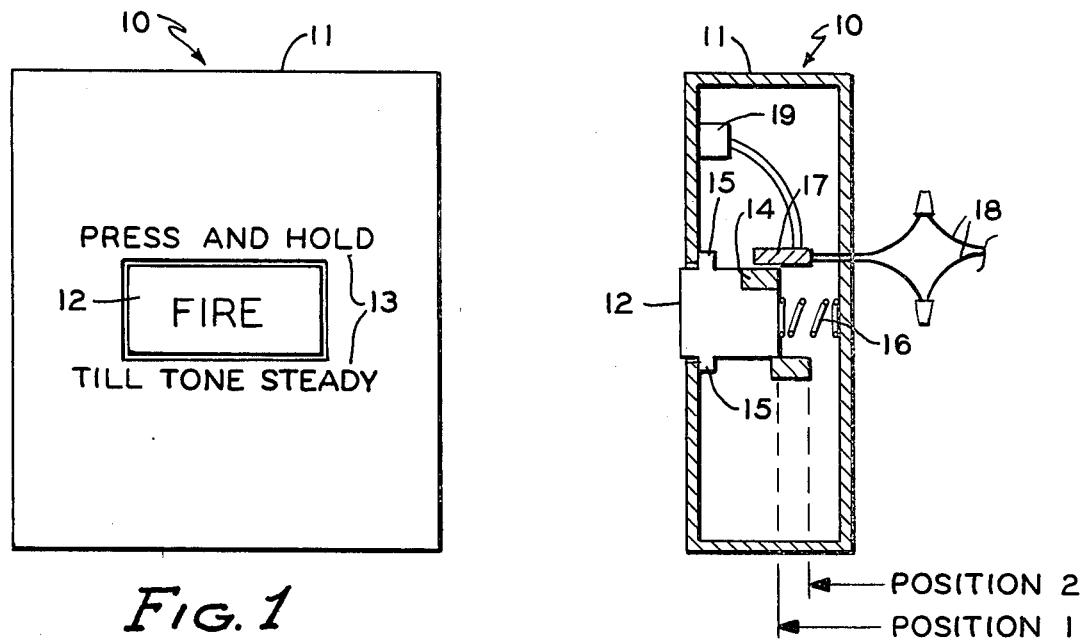
*Fig. 1*
*Fig. 2*
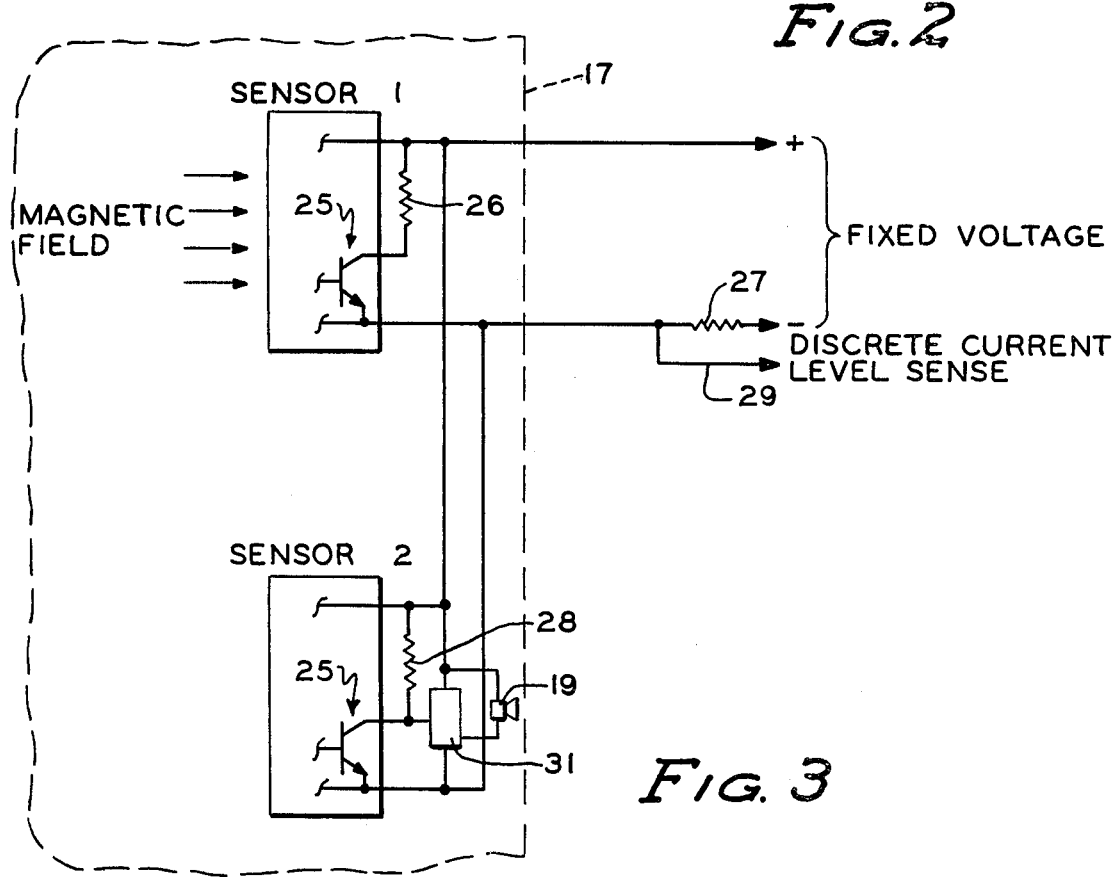
*Fig. 3*

HALL EFFECT ALARM PULL STATION

BACKGROUND OF THE INVENTION

This invention relates to an alarm pull station which is typically mounted on the wall of a building to be manually activated in the event of a fire or alarm occurence to transmit a signal to a local alarm and to a remote fire or police station and, more particularly, to such a manually operated pull station which incorporates a Hall effect sensing device.

Red fire alarm pull stations can be seen in schools, office buildings and various institutions. These pull stations typically comprise a red box having a glass panel which must be broken so that a manually operated lever can be depressed in the event of a fire for sounding a bell or other fire alarm device within the building so that it can be evacuated without loss of life and to also provide an alarm signal to a nearby fire station so that fire personnel can respond and minimize the damage to the building as quickly and efficiently as possible.

Such pull stations incorporate a wide variety of mechanical switching devices to sense the operation of the manually operated lever to provide the signal to the local alarm indicator and the signal to the remote fire or police station. Most of the mechanical or magnetic switches of the past have been subject to a myriad of problems. For example, moisture, dust, contact point wear and oxidation and corrosion have, either acting alone or in combination, impaired the operation of the pull station. Such pull stations are not as reliable as might otherwise be desired and have required too much maintence in order to maintain reliability. Moreover, these bulky mechanical arrangements are unnecessarily large resulting in excessive cost and less usefulness.

The present invention, however, incorporates a Hall effect magnetic sensing device in a pull station which operates in response to a magnet moved by a manual operator for providing an alarm signal which can be used by a local alarm indicator for warning the inhabitants of the building in which the pull station is located in the event of a fire and for providing a remote alarm signal to a fire station or police station so that the proper personnel can respond to the alarm occurrence. A pull station incorporating a Hall effect switching device is immune to moisture and dust, has no contact point wear since there are no mechanical contacts, is immune to mechanical contact bouncing since there are no mechanical contacts, involved, is immune to oxidation, tarnishing and corrosion, is substantially explosion proof, reliable, small and requires little maintenance. Moreover, such a device can be easily arranged to provide a normal signal when unactivated, an alarm signal when activated and a trouble signal when there is tampering of the pull station box or housing.

SUMMARY OF THE INVENTION

Thus, the present invention relates to an alarm pull station having a housing for attachment to a support, a manually movable member in the housing and having a magnet attached thereto, and a Hall effect switching device responsive to movement of the magnet for providing an output signal which can be used to provide a local alarm indication and/or a remote signal to a fire and/or police station.

BRIEF DESCRIPTION OF THE DRAWINGS

These and other features and advantages will become more apparent from a detailed consideration of the invention when taken in conjunction with the drawings in which:

FIG. 1 shows the housing of a pull station which can incorporate the present invention;

FIG. 2 shows a side partially cross-sectional view of the housing and its inventive contents; and, FIG. 3 shows a circuit diagram of the present invention.

DETAILED DESCRIPTION

In FIG. 1, pull station 10 includes housing 11 with a push button 12. Housing 11 may include instructions 13 thereon for indicating to the user how the pull station 10 should be used. In the event of a fire or other alarm occurrence, button 12 is depressed into housing 11 for activating an alarm. It should be apparent that any sort of mechanical actuator, such as a lever or bar, can be used for button 12.

In FIG. 2, button 12 is shown having magnet 14 mounted thereon. Button 12 has biasing spring 16 for biasing stops 15 against housing 11. Hall effect sensing device 17 may be suitably mounted within housing 11 to act as a guide for button 12. At the same time, Hall effect sensing device 17 senses movement of magnet 14 when button 12 is depressed against the action of spring 16 to provide a remote signal over lines 18 to a central station, fire station or police station for notifying appropriate personnel that the alarm button 12 has been activated. Also connected to Hall effect sensing device 17 is a warning device 19 which is energized upon activation of switch 12 for providing a local tone.

This tone can serve a plurality of functions. For example, it can provide a local alarm indication to warn the inhabitants of the building in which pull station 10 is located that a pull station has been activated and that a fire has occurred within the building. Moreover, the provision of a local alarm in the vicinity of the pull station should discourage false alarms.

FIG. 3 shows the Hall effect sensing device 17 and its connection for providing remote alarm indications in more detail. Hall effect device 17 may be supplied under part number 65SS2 by the Microswitch Division of Honeywell. Each Hall effect sensor comprises an amplifier 25 which switches on in the presence of a magnetic field as provided by magnetic 14. The device 17 may comprise any number of sensors but is shown incorporating two sensors for providing three levels of alarm signals. Specifically, sensor 1 is connected to a positive input terminal and the collector of transistor 25 is connected to the positive input terminal through resistor 26. The emitter of the transistor is connected to the negative input terminal through resistor 27. Likewise, the collector of transistor 25 of sensor 2 is connected to the positive voltage terminal through resistor 28 and the emitter is connected to the negative terminal through resistor 27. A latch 31 is also provided so that, when button 12 is depressed, alarm 19 and the signal transmitted over line 29 will be provided even though spring 16 returns button 12 to its original position. An output can be taken at line 29.

The two sensors are arranged such that the output line 29 will indicate three current levels. The first current level is provided when the button 12 is positioned with respect to the two sensors making up the Hall effect switching device 17 such that sensor 1 is activated but sensor 2 is not activated. The second current level is attained when button 12 is operated so that sensor 2 is switched and sensor 1 is switched off. This current level is the alarm current level and can be used for providing both the local warning by device 19 and a remote indication at the remote location to which line 28 is connected. It is to be noted that if sensor 2 does not switch on when the button is operated, the remote location will determine that a trouble condition exists. Finally, a third current level is provided when the housing 11 is subject to tampering such that a line is severed or button 12 is removed. If button 12 is removed, sensor 2 remains in its original state and sensor 1 switches off to provide the third current level. The third current level is also provided if one of the lines from device 17 is severed.

The embodiments of the invention in which an exclusive property or right is claimed are defined as follows:

1. An alarm pull station comprising:
   a housing for attachment to a support;
   a manually movable member mounted within said housing;
   magnet means attached to one of said housing and said manually movable member; and,
   Hall effect sensing means attached to the other of said housing and said manually movable member responsive to movement of said magnet means for providing an output signal, said Hall effect sensing means comprising first and second Hall effect sensors arranged for providing three levels of output signal, a first normal level when said manually movable member is in its original, unoperated position, an alarm level when said manually movable member is operated, and a trouble level when said pull station is subjected to tampering.

2. The pull station of claim 1 wherein said magnet means comprises a permanent magnet attached to and operable by said manually movable member.

3. A manual alarm pull station for providing an alarm output signal when said pull station is manually activated, said alarm output signal being useful for providing an indication of an alarm condition, said pull station comprising:
   a housing for attachment to a support;
   a manually movable member mounted within said housing, said housing having an opening for permitting access to said manually movable member;
   magnet means attached to one of said housing and said manually movable member; and,
   Hall effect sensing means attached to the other of said housing and said manually movable member responsive to movement of said magnetic means for providing an alarm output signal, said Hall effect sensing means comprising first and second Hall effect sensors arranged for providing three levels of output signal, a first normal level when said manually movable member is in its original, unoperated position, an alarm level when said manually movable member is operated, and a trouble level when said pull station is subjected to tampering.

4. The pull station of claim 3 wherein said magnet means comprises a permanent magnet attached to and operable by said manually movable member.

5. The pull station of claim 3 wherein said housing comprises an opening, said manually movable member comprises a button having a first portion exposed to said opening for activation through said opening, stops and biasing means for biasing said button so that said stops are biased against said housing whereby said manually movable member is biased in a normal position for providing a normal output signal.

6. The pull station of claim 5 wherein said magnet means comprises a permanent magnet attached to and operable by said manually movable member.

* * * * *